US006432732B1

(12) United States Patent
Zimlich

(10) Patent No.: US 6,432,732 B1
(45) **Date of Patent: *Aug. 13, 2002**

(54) METHOD AND STRUCTURE FOR LIMITING EMISSION CURRENT IN FIELD EMISSION DEVICES

(75) Inventor: David Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,640

(22) Filed: Jun. 19, 2000

Related U.S. Application Data

(63) Continuation of application No. 08/748,816, filed on Nov. 14, 1996, now Pat. No. 6,130,106.

(51) Int. Cl.[7] ................................................ H01L 21/00

(52) U.S. Cl. ........................................... 438/20; 445/24

(58) Field of Search ............................ 438/20; 313/336, 313/309; 445/24

(56) References Cited

U.S. PATENT DOCUMENTS

| | | | | | |
|---|---|---|---|---|---|
| 4,766,340 | A | * | 8/1988 | van der Mast et al. | 313/366 |
| 4,940,916 | A | | 7/1990 | Borel et al. | 313/306 |
| 5,210,472 | A | | 5/1993 | Casper et al. | 315/349 |
| 5,229,331 | A | | 7/1993 | Doan et al. | 438/20 |
| 5,354,694 | A | | 10/1994 | Field et al. | 438/20 |
| 5,420,054 | A | | 5/1995 | Choi et al. | 438/20 |
| 5,532,177 | A | | 7/1996 | Cathey | 438/20 |
| 5,710,478 | A | * | 1/1998 | Kanemaru et al. | 313/336 |
| 5,818,153 | A | | 10/1998 | Allen | 438/20 |

* cited by examiner

*Primary Examiner*—Tuan H. Nguyen
(74) *Attorney, Agent, or Firm*—Hale and Dorr LLP

(57) ABSTRACT

A field emission display has electron emitters that are current-limited by implanting in a silicon layer only enough ions to produce a desired current, and then forming emitters from the silicon layer by isotropic etching.

8 Claims, 3 Drawing Sheets

METHOD AND STRUCTURE FOR LIMITING EMISSION CURRENT IN FIELD EMISSION DEVICES

CROSS-REFERENCE TO RELATED APPLICATION

This application is a continuation of Ser. No. 08/748,816 filed Nov. 14, 1996 now U.S. Pat. No. 6,130,106.

STATEMENT OF GOVERNMENT RIGHTS

This invention was made with Government support under Contract No. DABT63-93-C-0025 awarded by the Advanced Research Projects Agency ARPA). The Government may have certain rights in this invention.

BACKGROUND OF THE INVENTION

This invention relates to field emission devices.

A field emission display (FED) has a cathode with a selectable array of thin film emitters, and a phosphor coated anode, as shown, for example, in U.S. Pat. No. 5,210,472, which is assigned to the same assignee and is incorporated by reference for all purposes. The emitters are typically sharp pointed cones formed over a conductive layer. These emitters emit electrons in the presence of an intense electric field between an extraction grid over the emitters and the conductive layer. The electrons bombard the anode to provide a light image that can be viewed. By selecting desired emitters and controlling the charge delivered to the phosphor in a given pixel, the brightness of the pixel can be varied. The change in brightness is generally proportional to the increase in the delivered charge.

As current from the emitter increases, resistance decreases, thus increasing the current and resulting in a runaway condition. To avoid this problem, continuous current-limiting resistive layers were provided between emitters and conductive layers in “Current Limiting of Field Emitter Array Cathodes,” a thesis by K. Lee at the Georgia Institute of Technology, August, 1986; and Borel, U.S. Pat. No. 4,940,916. Such current-limiting resistors in series with the emitters have several drawbacks: they can short during operation; other defects can occur during processing, thus resulting in inoperable cathode emitters; and if a number of tips fail, the current can still exceed thresholds.

SUMMARY OF THE INVENTION

According to the present invention, current is limited in FED emitters by controllably implanting ions in a silicon layer to produce a desired maximum current in the resulting emitter tips. The implanted ions are diffused downwardly by heating after the implantation step, or upwardly by forming an epitaxial layer over the silicon layer. A next implantation step provides a more heavily doped n-type region where the tips of the emitters will be formed to reduce the work function. The emitter itself is thus current-limited and does not need an additional resistive layer in series.

The present invention removes from the fabrication process relative nonuniform steps of forming resistors and substitutes one or more highly controllable ion implantation steps. The present invention limits current while avoiding the need for a separate layer of resistive material in series with the emitters. Other features and advantages will become apparent from the following detailed description, drawings, and claims.

DETAILED DESCRIPTION

Figure 1:
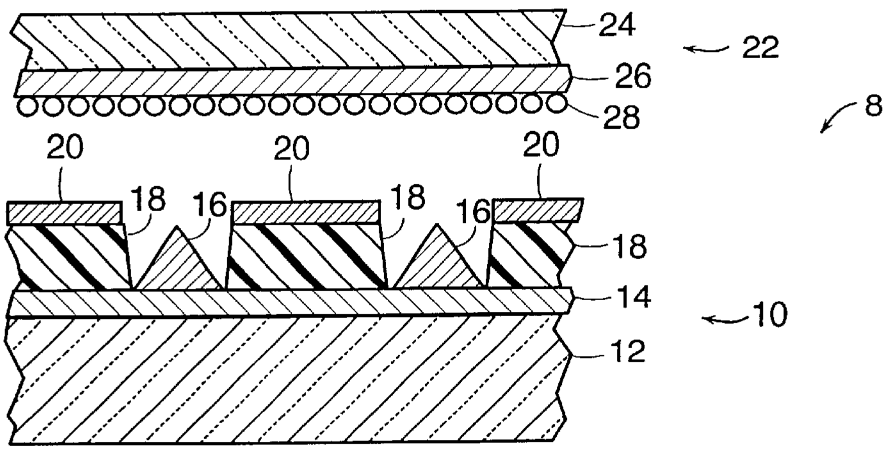
FIG. 1 PRIOR ART
FIG. 1 is a cross-sectional view of a known embodiment of a cathode.

In prior field emissions devices (FEDs) as shown in FIG. 1, an FED cathode 10 has a substrate 12, such as glass or single crystal silicon, a conductive layer 14 formed on substrate 12, and many generally conical emitters 16 on conductive layer 14. It is known to form emitters 16 by isotropically etching a polysilicon layer that is heavily doped to give a low work function, i.e., to require low turn-on energy for the emitters to operate. Emitters 16 are surrounded by a dielectric layer 18 over which a conductive extraction grid 20 is formed. When activated by controlled voltage between grid 20 and emitters 16, emitters 16 emit electrons that strike an anode 22. Anode 22 has a transparent glass substrate 24, a transparent conductive layer 26, preferably indium tin oxide (ITO), over substrate 24, and phosphor particles 28 over pixel regions on layer 26. When the electrons strike the anode a light image is produced. If the voltage between grid 18 and emitters 16 increases too much, the current can increase above an upper threshold level, e.g., 10 microamps, and cause local or even complete failure. To limit this current, it has been known to provide resistors in series with emitters 16 in a layer between the emitter and conductor.

Figure 2:
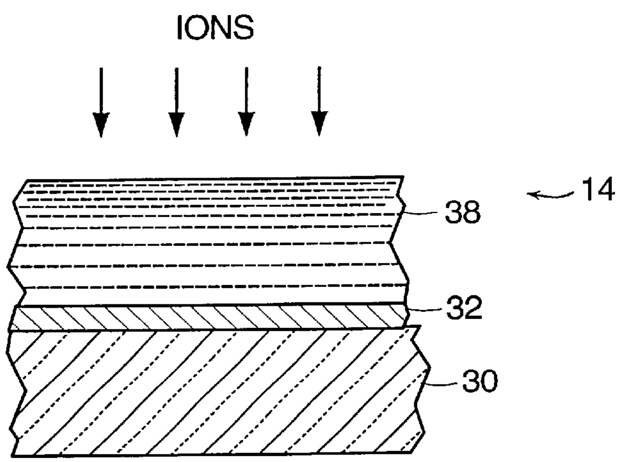
FIGS. 2–7 are cross-sectional views through a cathode to illustrate the formation of an emitter according to various embodiments of the present invention.
Figure 3:
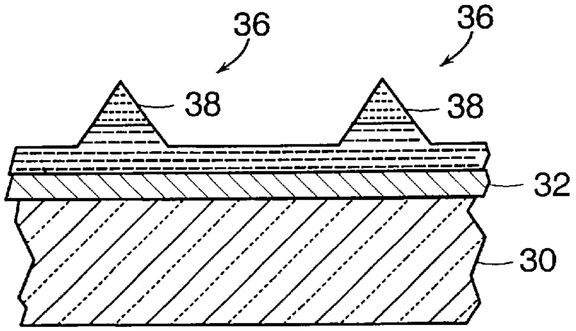

Referring to FIGS. 2 and 3, according to the present invention, rather than providing a separate resistive layer or separate external resistors to limit current, current is limited by the construction of the emitter itself. By implanting ions in an appropriate manner, an emitter with a maximum desired current is produced. The emitters are formed from a three-layered structure that has a substrate 30, a conductive layer 32, and a silicon layer 34. Substrate 30 can be made from single crystal silicon or a dielectric material such as glass, conductive layer 32 can be a metal, such as aluminum or chrome, and silicon layer 34 is preferably polysilicon. Portions of layer 34 are later removed, e.g., by isotropic etching, to form generally conical emitter. Before silicon layer 34 is etched, ions are implanted by ion implantation, a well-known and highly controllable process. The number of implanted ions is set at a desired maximum to limit the current from the resulting emitter to a maximum amount regardless of the voltage applied across the grid and conductive layer 32. The current may be limited to a specific threshold that is below a current level at which arcing and/or shorting will occur.

Silicon layer 34 may be doped with implanted electronegative (donor) ions, such as arsenic, antimony, or phosphor, to produce an n-type silicon layer. The structure is then preferably heated to cause the ions to diffuse downwardly as deep as conductive layer 32 to form a good contact with layer 32. A second ion implantation step is performed with little drive-in to produce an $n^+$-type region 38 where the tips of the emitters will be formed. This second implantation step will help lower the work function of the device.

Alternatively, silicon layer 34 can be lightly doped with electropositive (acceptor) ions, such as boron, to produce a $p^-$-type silicon layer. Use of such ions is advantageous because a p-type layer is less sensitive than an n-type layer to light reflected within the FED. The $p^-$-type silicon layer is heated to diffuse the ions downwardly to conductive layer 32. Next, layer 34 is implanted with an $n^+$ doping to provide a high concentration of ions where the tips of the emitters will be formed to provide a low work function. Following either of these series of doping steps, silicon layer 34 is isotropically etched in a known manner to form emitters 36 that are essentially pyramidal with bases on conductive layer 32. As used here, "pyramidal" includes conical or any other solid with a base at one end and some convergence to a pointed tip at another end, and including the situation when etching between emitters does not extend all the way down to conductive layer 32 as shown in FIG. 3, in which the base portion is the region under the exposed pyramidal portion.

In either of these embodiments, this second implantation step can be performed after the tips have been at least partially exposed through etching or with a known planarization technique. As a result, the ion concentration is highest at the tip.

As an alternative to the second implantation step, a thin film of material, such as cesium, that can reduce the work function of the emitters, is deposited, e.g., with chemical vapor deposition (CVD), over the silicon layer after the first ion-implantation step.

By knowing the desired maximum emission current, the maximum number of ions needed in the emitter can be calculated approximately. As is well known, charge is the product of current and time. In this case, a time of 34 microseconds is used, because in a Video Graphics Array (VGA) there are 480 rows refreshed 60 times per second, which means 34 microseconds per row. Different times could be used for other systems or protocols, such as Super VGA (SVGA). If a maximum current of 10 microamps is desired, $(i)(t)=3.4\times10^{-10}$ coulombs. Because there are $6.38\times10^{18}$ electrons per coulomb, the total desired charge is $2.142\times10^{9}$. Assuming an average emitter cross-sectional area of 1 micron$^2$, i.e., $10^{-8}$ cm$^2$, the maximum implant is $2.142\times10^{17}$ atoms per cm$^2$. With two or more implantation steps, the number of implanted atoms will have to be allocated accordingly between or among the steps. This approximate number of atoms may have to be adjusted by those performing the processing based on experience with the particular processes that are employed, such as the type of etching that is used and how much etching is done.

Figure 4:
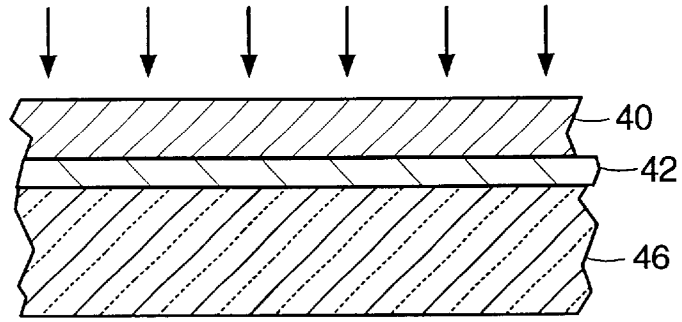
Figure 5:
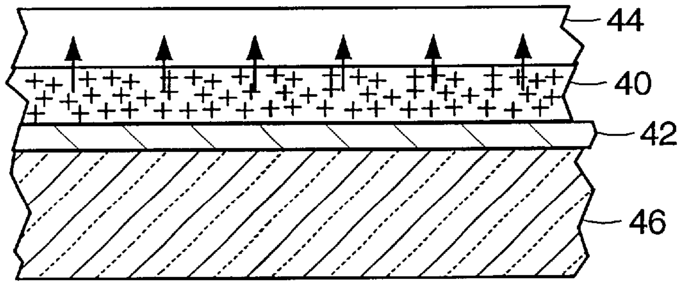
Figure 6:
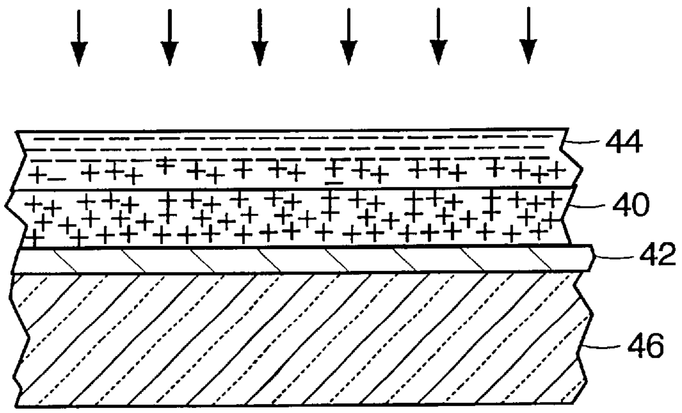

Referring to FIGS. 4–6, while implanting from the top, diffusing downwardly, and implanting again is one operable approach, other series of processing steps could be used, including processes that include diffusing upwardly into a emitter region. In one exemplary approach, a silicon layer 40 is formed over a conductive layer 42, such as doped silicon, which is formed over a single crystal silicon substrate 46. Silicon layer 40 is lightly doped to produce a $p^-$ or $p^-$ silicon layer (FIG. 4). An epitaxial silicon layer 44 is formed over silicon layer 40, causing ions from layer 40 to diffuse upwardly into the epitaxial layer 44 (FIG. 5). A second ion implantation step is performed with little drive-in to produce an n+region at the top of the epitaxial layer and thus where the tips of the emitter will be formed (FIG. 6). As noted above, the emitters are then formed by removing portions of the silicon layer, preferably by isotropic etching. After the emitters are formed, further processing is done to produce the dielectric (oxide) layer around the emitters and the conductive grid over the dielectric layer (FIG. 1). Other materials that can withstand the epitaxial process could be used, such as chrome for the conductive layer.

Figure 7:
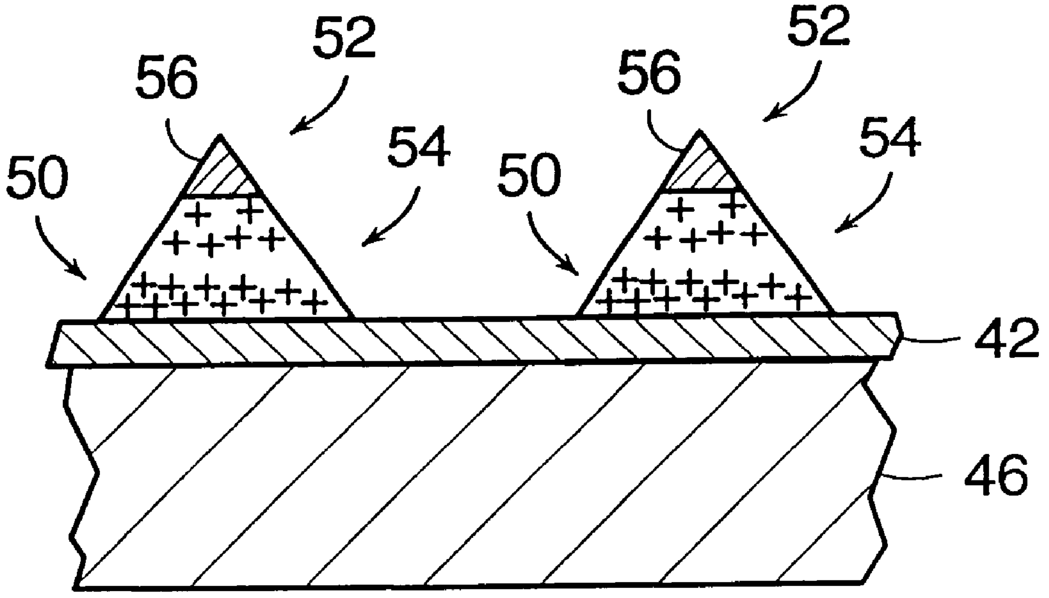

Referring to FIG. 7, the second implantation step can be replaced with a step of dispositing over epitaxial silicon layer 44 a material, such as cesium, that reduces the work function. In this case, the ion concentration may be highest at or near the bases 50 of ohmic emitters 52, to conductive layer 42. The concentration in middle portions 54 is less, while the cesium layer 56 reduces the work function.

An emitter formed from the layered structure of FIG. 6 can effectively operate like a MOSFET in an enhanced region with the base of the emitter serving as a source, the p-type region serving as the bulk, the emitter tip functioning as a drain, and the grid serving as a gate. The emitter/grid may saturate, meaning that an increase in grid voltage will not substantially increase emitter current. As with an FED, the current will be limited for different grid voltages.

Having described embodiments of the present invention, it should be apparent that modifications and can be made without departing from the scope of the invention as defined by the appended claims. While each method preferably involves two implantation steps, additional such implantation steps can be used, provided that the maximum number of ions is provided in the tips.

What is claimed is:

1. A method for forming a cathode for an FED comprising:

forming a layered structure with a silicon layer over a conductive layer;

a first implanting of ions of a first conductivity into the silicon layer;

a second implanting of ions of the first conductivity type into the silicon layer, the second implanting being performed with a higher dosage of ions than the dosage of the first implanting and without an implanting process of ions of the second conductivity type between the first implanting and the second implanting; and removing portions of the silicon layer to produce a plurality of conical emitters with the implanted ions limiting the current in emitters.

2. The method of claim 1, further comprising, prior to the first and second implanting, determining a maximum current for the conical emitters, and selecting the dosages for the implanting to limit current to the determined maximum.

3. The method of claim 1, wherein the first conductivity type is n-type.

4. The method of claim 1, wherein the second implanting occurs before the removing.

5. The method of claim 1, wherein the second implanting occurs after the removing.

6. The method of claim 1, further comprising forming a conductive gate layer around the emitters, wherein there is a maximum current in the emitters regardless of any voltage applied to the gate layer.

7. The method of claim 1, further comprising, after the first implanting and before the second implanting, heating the layers to cause the ions to diffuse to a location that will be the bases of the emitters after the removing.

8. The method of claim 1, further comprising heating after the first implanting so that the ions diffuse to the conductive layer.

* * * * *